(12) United States Patent
Kiyama et al.

(10) Patent No.: US 8,498,525 B2
(45) Date of Patent: *Jul. 30, 2013

(54) HEAT TREATMENT APPARATUS AND METHOD FOR HEATING SUBSTRATE BY LIGHT IRRADIATION

(75) Inventors: Hiroki Kiyama, Kyoto (JP); Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/293,641

(22) Filed: Nov. 10, 2011

(65) Prior Publication Data

US 2012/0114316 A1    May 10, 2012

Related U.S. Application Data

(63) Continuation of application No. 12/421,896, filed on Apr. 10, 2009, now Pat. No. 8,145,046.

(30) Foreign Application Priority Data

Apr. 16, 2008    (JP) ................. JP2008-106894

(51) Int. Cl.
*F24C 7/00*    (2006.01)
(52) U.S. Cl.
USPC ............... 392/407; 392/418; 219/411
(58) Field of Classification Search
None
See application file for complete search history.

(56) References Cited

U.S. PATENT DOCUMENTS

| | | | |
|---|---|---|---|
| 6,936,797 B2 | 8/2005 | Hosokawa | |
| 6,998,580 B2 | 2/2006 | Kusuda et al. | |
| 7,183,229 B2 | 2/2007 | Yamanaka | |
| 7,381,928 B2 | 6/2008 | Kusuda et al. | |
| 7,616,872 B2 | 11/2009 | Camm et al. | |
| 8,173,937 B2 * | 5/2012 | Yokouchi | ............. 219/411 |
| 2008/0190909 A1 | 8/2008 | Yokouchi | |
| 2008/0273867 A1 | 11/2008 | Camm et al. | |
| 2009/0103906 A1 | 4/2009 | Kusuda | |
| 2009/0166351 A1 | 7/2009 | Yokomori | |

(Continued)

FOREIGN PATENT DOCUMENTS

| | | |
|---|---|---|
| JP | 2002-252174 | 9/2002 |
| JP | 2005-150608 | 6/2005 |
| JP | 2010-525581 | 7/2010 |

OTHER PUBLICATIONS

Japanese Office Action mailed Apr. 2, 2013 in connection with corresponding Japanese Patent Application No. 2008-106894 and English translation thereof.

*Primary Examiner* — Thor Campbell (74) *Attorney, Agent, or Firm* — Ostrolenk Faber LLP (57) ABSTRACT

In light-irradiation heating with a total irradiation time of one second or less, two-stage irradiation is performed, including a first stage of light irradiation of a semiconductor wafer, which irradiation produces an output waveform that reaches a peak at a given emission output; and a second stage of supplemental light irradiation of the semiconductor wafer, which irradiation is started after the peak, producing an emission output smaller than the above given emission output. The emission output in the second stage is two thirds or less than the above given emission output at the peak. The first-stage light-irradiation time is between 0.1 and 10 milliseconds, and the second-stage light-irradiation time is 5 milliseconds or more.

5 Claims, 10 Drawing Sheets

U.S. PATENT DOCUMENTS

2009/0263112 A1* 10/2009 Kiyama et al. ............... 392/418
2009/0285568 A1   11/2009 Kiyama et al.
2010/0111513 A1*  5/2010 Nishihara et al. ............ 392/418
2010/0178776 A1*  7/2010 Kato ............................ 438/795
2011/0274417 A1   11/2011 Camm et al.

* cited by examiner

F I G . 1

CONTROLLER
3

HEAT TREATMENT APPARATUS AND METHOD FOR HEATING SUBSTRATE BY LIGHT IRRADIATION

CROSS REFERENCE TO RELATED APPLICATION

This application is a continuation of U.S. application Ser. No. 12/421,896, filed Apr. 10, 2009, by Hiroki KIYAMA, et. al., entitled HEAT TREATMENT APPARATUS AND METHOD FOR HEATING SUBSTRATE BY LIGHT IRRADIATION which claims the benefit of Japanese Appln. S.N. JP2008-106894 filed Apr. 16, 2008, the contents of which are incorporated by this reference.

BACKGROUND OF THE INVENTION

1. Field of the Invention

The present invention relates to a heat treatment apparatus and method for heating a semiconductor wafer, a glass substrate for liquid crystal display, and the like (hereinafter referred to simply as a "substrate") by light irradiation of the substrate.

2. Description of the Background Art

Conventionally, a lamp annealer employing halogen lamps has been commonly used in the step of activating ions in a semiconductor wafer after ion implantation. Such a lamp annealer carries out the activation of ions in a semiconductor wafer by heating (or annealing) the semiconductor wafer to a temperature of the order of, for example, 1000 to 1100° C. In such a heat treatment apparatus, the energy of light emitted from halogen lamps is used to raise the substrate temperature at a rate of about several hundred degrees per second.

In recent years, with increasing degree of integration of semiconductor devices, it has been desired that the junction be made shallower with decreasing gate length. It has, however, turned out that even if the above lamp annealer, which raises the temperature of a semiconductor wafer at a rate of about several hundred degrees per second, is used to carry out the activation of ions in a semiconductor wafer, there still occurs a phenomenon that boron, phosphorous, or other ions implanted in the semiconductor wafer are deeply heat-diffused. The occurrence of such a phenomenon gives rise to apprehension that the junction may become deeper than the desired level, hindering good device formation.

With regard to this, U.S. Pat. Nos. 6,998,580 and 6,936,797 disclose techniques for raising only the surface temperature of an ion-implanted semiconductor wafer within an extremely short period of time (several milliseconds or less) by irradiating the surface of the semiconductor wafer with flash light from xenon flash lamps (The term "flash lamp" as used hereinafter refers to the "xenon flash lamp.") The xenon flash lamps have a spectral distribution of radiation ranging from ultraviolet to near-infrared regions. The wavelength of the light emitted from xenon flash lamps is shorter than that of the light emitted from conventional halogen lamps, and it almost coincides with a fundamental absorption band of a silicon semiconductor wafer. Thus, when a semiconductor wafer is irradiated with the flash light emitted from xenon flash lamps, the temperature of the semiconductor wafer can be raised rapidly with only a small amount of light transmitted through the semiconductor wafer. It has also turned out that the flash light emitted within an extremely short period of time such as several milliseconds or less allows a selective temperature rise only near the surface of a semiconductor wafer. Such an extremely-short-time temperature rise with xenon flash lamps will allow only the ion activation to be implemented without deep diffusion of ions.

Now, as a result of the high-energy ion implantation prior to the flash heating, a number of defects are introduced into a silicon crystal of a semiconductor wafer. Such defects tend to be introduced to a somewhat greater depth below the ion-implanted layer. For the implementation of flash heating, it is hence desirable that not only the ion activation but also the restoration of introduced defects be carried out together.

However, in extremely-short-time irradiation where the time of light emission from the flash lamps is only about one millisecond, the speed of a temperature rise at the surface of the semiconductor wafer is higher than the speed of heat transmission to the inside of the semiconductor wafer by thermal conductivity of silicon. This enables a temperature rise in the ion-implanted layer, but not to the depth to which defects are introduced. Nevertheless, if extremely high-energy light is emitted from the flash lamps, it would be possible, even by extremely-short-time irradiation for about one millisecond, to raise the temperature at a depth to which defects are introduced and thereby to restore those defects. However, there arises a problem that the surface temperature would rise considerably, giving damage to the semiconductor wafer.

There has also been a suggestion to prolong the time of light irradiation by the flash lamps to about several milliseconds by controlling the coil constant of a power supply circuit for supplying power to the flash lamps. Such prolonging of the irradiation time to about several milliseconds is considered effective in restoring defects introduced during ion implantation, because it allows a temperature rise not only at the surface of the semiconductor wafer but also to a somewhat greater depth inside the semiconductor wafer. However, there is a possibility that prolonging the time of light irradiation by the flash lamps may cause the generation of new crystal defects because of a continuous temperature rise at the surface of a semiconductor wafer.

SUMMARY OF THE INVENTION

The present invention is directed to a heat treatment method for heating a substrate by light irradiation of the substrate.

According to an aspect of the invention, the heat treatment method includes the following steps: a first light-irradiation step of performing light irradiation of a substrate, producing an output waveform that reaches a peak at a first emission output; and a second light-irradiation step of performing supplemental light irradiation of the substrate after the peak, producing an emission output smaller than the first emission output, wherein a total of a light irradiation time in the first light-irradiation step and a light irradiation time in the second light-irradiation step is one second or less.

Since the surface temperature of the substrate which has been raised in the first light-irradiation step can be maintained generally as it is even during the second light-irradiation step, the temperature even at a depth where defects are introduced can be raised to some extent without the substrate surface being heated excessively. This allows the implementation of both the activation of implanted ions and the restoration of introduced defects without any damage to the substrate.

Preferably, the supplemental light irradiation in the second light-irradiation step is started after the peak and when an emission output in the first light-irradiation step becomes two thirds or less the first emission output.

Since the surface temperature of the substrate will never considerably exceed its temperature raised in the first light-irradiation step, possible damage to the substrate can be prevented with reliability.

The present invention is also directed to a heat treatment apparatus for heating a substrate by light irradiation of the substrate.

According to another aspect of the invention, the heat treatment apparatus includes the following: a holder for holding a substrate; a light irradiation part for irradiating the substrate held by the holder with light; a light-emission controller for controlling an emission output of the light irradiation part. The light-emission controller is configured to control an emission output of the light irradiation part in such a manner that, within a time range that a total time of light irradiation is one second or less, light irradiation of the substrate is performed, producing an output waveform that reaches a peak at a first emission output; and then after the peak, supplemental light irradiation of the substrate is performed, producing an emission output smaller than the first emission output.

Since the temperature even at a depth where defect are introduced can be raised to some extent without the substrate surface being heated excessively, and because the initially raised surface temperature of the substrate is maintained generally as it is thereafter, both the activation of implanted ions and the restoration of introduced defects can be implemented without any damage to the substrate.

Preferably, the light-emission controller is configured to control the emission output of the light irradiation part in such a manner that the supplemental light irradiation is started after the peak and when the emission output becomes two thirds or less the first emission output.

Since the surface temperature of the substrate will never considerably exceed its temperature initially raised, possible damage to the substrate can be prevented with reliability.

An object of the invention is thus to implement both the activation of implanted ions and the restoration of introduced defects without any damage to the substrate.

These and other objects, features, aspects and advantages of the invention will become more apparent from the following detailed description of the invention when taken in conjunction with the accompanying drawings.

DESCRIPTION OF THE PREFERRED EMBODIMENTS

A preferred embodiment of the invention is now described in detail with reference to the drawings.

Figure 1:
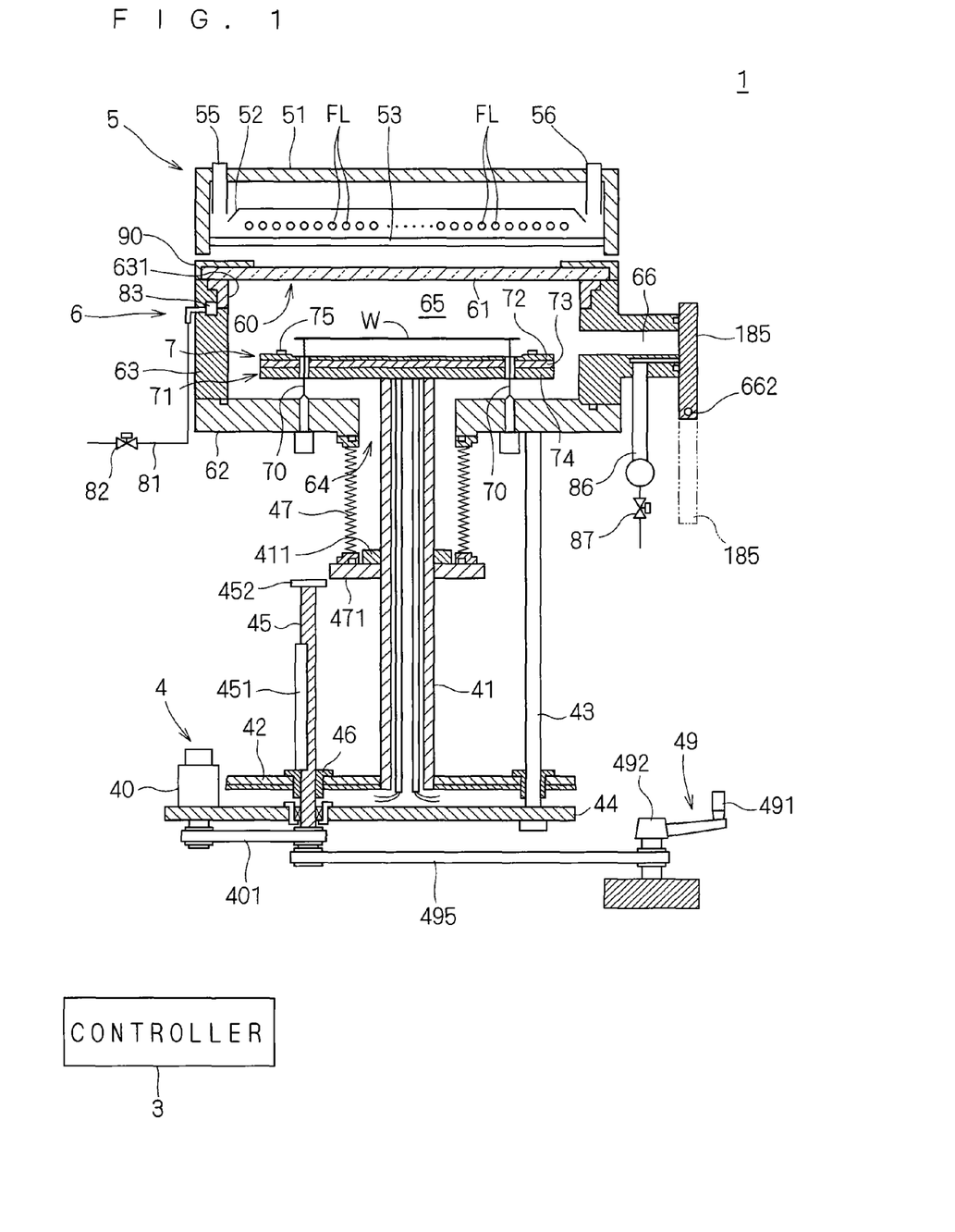
FIG. 1 is a side sectional view of a configuration of a heat treatment apparatus according to the present invention.

First, a general configuration of a heat treatment apparatus according to the invention is outlined. FIG. 1 is a side sectional view of a configuration of a heat treatment apparatus 1 according to the invention. The heat treatment apparatus 1 shall be a lamp annealer for applying light to a generally disc-shaped semiconductor wafer W serving as a substrate to thereby heat the semiconductor wafer W.

The heat treatment apparatus 1 includes a generally-cylindrical chamber 6 for receiving a semiconductor wafer W therein; and a lamp house 5 including a plurality of built-in flash lamps FL. The heat treatment apparatus 1 further includes a controller 3 for controlling each operating mechanism provided in the chamber 6 and in the lamp house 5 for the implementation of the heat treatment of a semiconductor wafer W.

The chamber 6 is located below the lamp house 5 and includes a chamber side portion 63 having a generally-cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits light emitted from the lamp house 5 into the heat treatment space 65. The chamber bottom portion 62 and the chamber side portion 63, which form the main body of the chamber 6, are made of, for example, a metal material such as stainless steel with high strength and high heat resistance; and an upper ring 631 on the inner side face of the chamber side portion 63 is made of an aluminum (Al) alloy or the like with greater durability than stainless steel against degradation due to light emission.

The chamber bottom portion 62 has a plurality of (three, in this preferred embodiment) support pins 70 extending upright therefrom through a holder 7 in order to support a semiconductor wafer W from the underside (the surface opposite to the surface receiving light from the lamp house 5) of the semiconductor wafer W. The support pins 70 are made of, for example, quartz and can be replaced easily because they are secured from outside the chamber 6.

The chamber side portion 63 has a transport opening 66 for transport of a semiconductor wafer W. The transport opening 66 is openable and closable by a gate valve 185 that pivots about an axis 662. On the opposite side of the chamber side portion 63 from the transport opening 66, an inlet passage 81 is formed, which introduces a processing gas (e.g., an inert gas such as a nitrogen ($N_2$) gas, a helium (He) gas, or an argon (Ar) gas; or an oxygen ($O_2$) gas and the like) into the heat treatment space 65. The inlet passage 81 has one end connected through a valve 82 to a gas supply mechanism not shown and the other end connected to a gas inlet buffer 83 formed inside the chamber side portion 63. The transport opening 66 has an outlet passage 86 formed to exhaust a gas within the heat treatment space 65 and connected through a valve 87 to an exhaust mechanism not shown.

Figure 2:
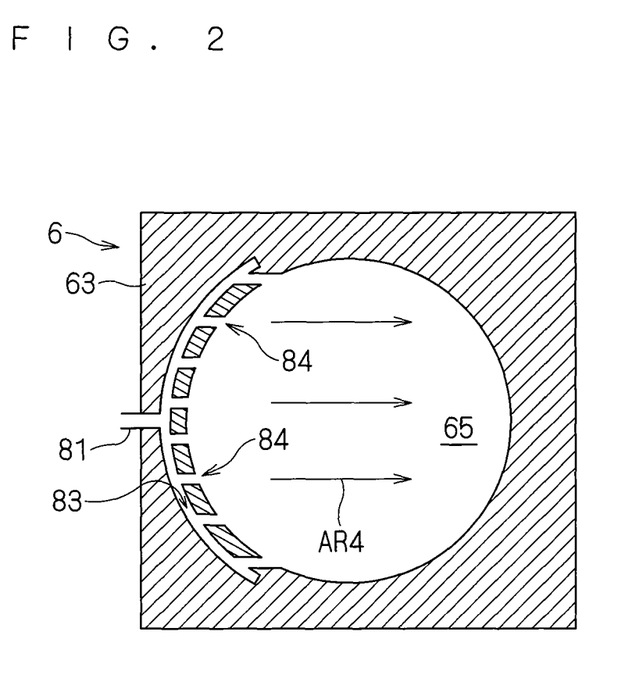
FIG. 2 is a sectional view of a gas passage in the heat treatment apparatus in FIG. 1.

FIG. 2 is a sectional view of the chamber 6 taken along a horizontal plane at the level of the gas inlet buffer 83. As illustrated in FIG. 2, the gas inlet buffer 83 is formed to extend over about one third the inner periphery of the chamber side portion 63 on the opposite side from the transport opening 66 in FIG. 1, so that the processing gas introduced into the gas inlet buffer 83 through the inlet passage 81 is supplied through a plurality of gas supply holes 84 into the heat treatment space 65.

The heat treatment apparatus 1 further includes the generally disk-shaped holder 7 for holding a semiconductor wafer W in a horizontal position inside the chamber 6 and preheating the holding semiconductor wafer W prior to light irradiation; and a holder elevating mechanism 4 for moving the holder 7 vertically relative to the chamber bottom portion 62 which is the bottom of the chamber 6. The holder elevating mechanism 4 in FIG. 1 includes a generally cylindrical shaft 41, a movable plate 42, guide members 43 (in the present preferred embodiment, three guide members 43 are located around the shaft 41), a fixed plate 44, a ball screw 45, a nut 46, and a motor 40. The chamber bottom portion 62, which is the bottom of the chamber 6, has a generally circular lower opening 64 having a smaller diameter than the holder 7. The shaft 41 of stainless steel extends through the lower opening 64 and is connected to the underside of the holder 7 (strictly speaking, a hot plate 71 of the holder 7) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is installed on the fixed plate 44 mounted to the lower ends of the guide members 43 and is connected to the ball screw 45 via a timing belt 401. When the holder elevating mechanism 4 moves the holder 7 vertically, the motor 40 serving as a driver rotates the ball screw 45 under the control of the controller 3 so that the movable plate 42 fixed to the nut 46 is moved along the guide members 43 in a vertical direction. The result is that the shaft 41 fixed to the movable plate 42 is moved in a vertical direction so that the holder 7 connected to the shaft 41 is moved up and down smoothly between a transfer position for transfer of a semiconductor wafer W in FIG. 1 and a processing position for processing of the semiconductor wafer W in FIG. 5.

On the upper surface of the movable plate 42, a mechanical stopper 451 of a generally semi-cylindrical shape (the shape formed by cutting a cylinder into half along the length) extends upright along the ball screw 45. Even if any anomalies happen to cause the movable plate 42 to move up beyond a given upper limit, the top end of the mechanical stopper 451 will strike an end plate 452 provided at the end of the ball screw 45, preventing an irregular upward movement of the movable plate 42. This prevents the holder 7 from being moved up beyond a given level under the chamber window 61, thus avoiding a collision of the holder 7 with the chamber window 61.

The holder elevating mechanism 4 further includes a manual elevator 49 for manually moving the holder 7 up and down for maintenance of the interior of the chamber 6. The manual elevator 49 includes a handle 491 and a rotary shaft 492 and can move the holder 7 up and down by rotating the rotary shaft 492 with the handle 491 to thereby rotate the ball screw 45 connected to the rotary shaft 492 via a timing belt 495.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member 411. The bellows 47 will contract when the holder elevating mechanism 4 moves the holder 7 upwardly relative to the chamber bottom portion 62, while they will expand when the holder elevating mechanism 4 moves the holder 7 downwardly. The expansion and contraction of the bellows 47 allows the heat treatment space 65 to be kept air-tight even during the upward and downward movement of the holder 7.

Figure 3:
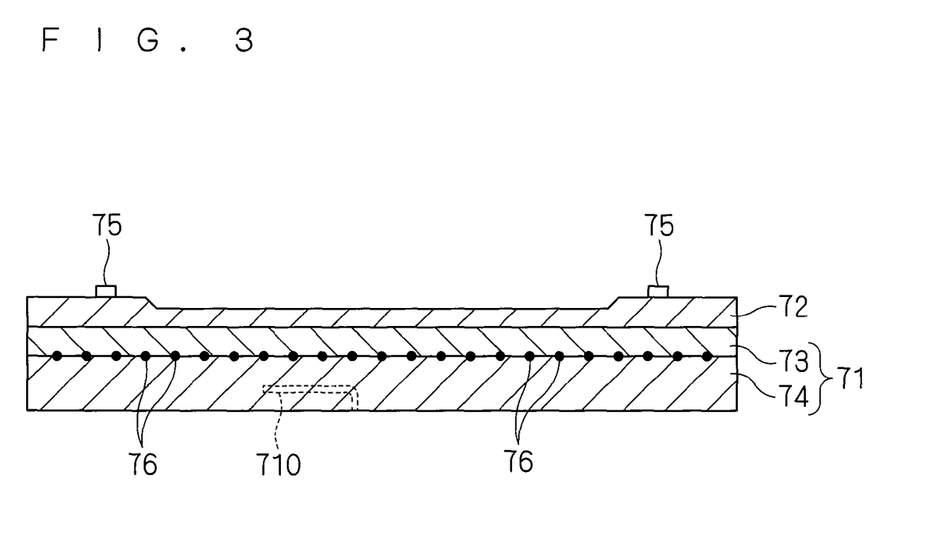
FIG. 3 is a sectional view of the structure of a holder.

FIG. 3 is a sectional view of the structure of the holder 7. The holder 7 includes the hot plate (heating plate) 71 for preheating (what is called assisted-heating) a semiconductor wafer W; and a susceptor 72 installed on the upper surface (the face where the holder 7 holds a semiconductor wafer W) of the hot plate 71. The underside of the holder 7 is, as described previously, connected to the shaft 41 for moving the holder 7 up and down. The susceptor 72 is made of quartz (or it may be of aluminum nitride (AlN) and the like) and has, on the upper surface, pins 75 for preventing misalignment of a semiconductor wafer W. The susceptor 72 is provided on the hot plate 71, with its underside in face-to-face contact with the upper surface of the hot plate 71. The susceptor 72 is thus capable of diffusing and transmitting heat energy from the hot plate 71 to a semiconductor wafer W placed on its upper surface and is cleanable during maintenance by being removed from the hot plate 71.

The hot plate 71 includes an upper plate 73 and a lower plate 74, both made of stainless steel. Resistance heating wires 76 such as nichrome wires for heating the hot plate 71 are installed between the upper and lower plates 73 and 74, and a space between the upper and lower plates 73 and 74 is filled and sealed with electrically conductive brazing nickel (Ni). The upper and lower plates 73 and 74 are brazed to each other at their ends.

Figure 4:
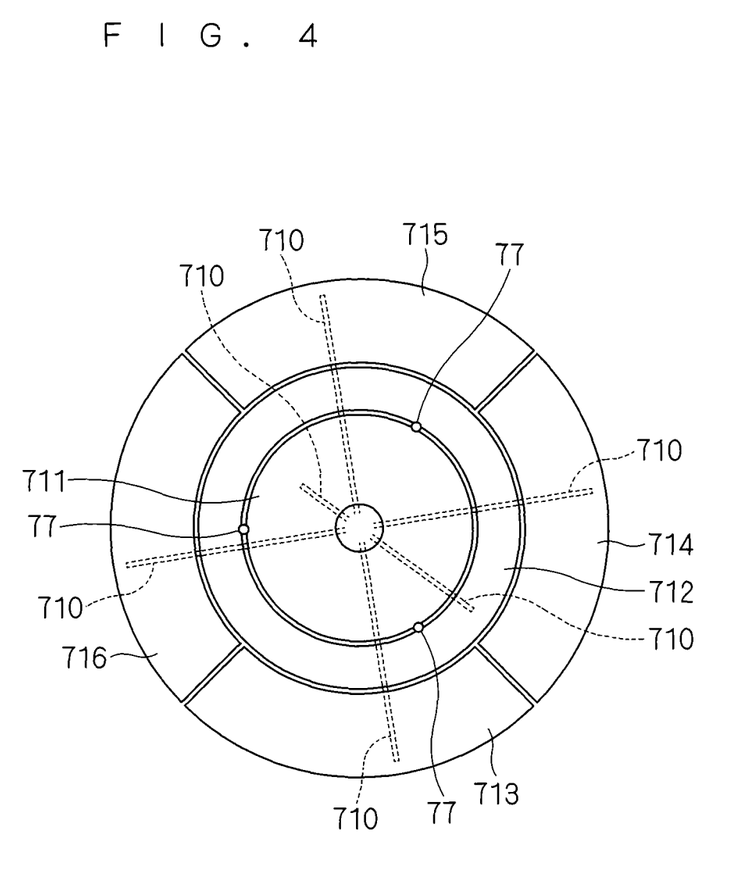
FIG. 4 is a plan view of a hot plate.

FIG. 4 is a plan view of the hot plate 71. As illustrated in FIG. 4, the hot plate 71 has a disk-shaped zone 711 and a ring-shaped zone 712 that are concentrically arranged in the central portion of an area facing a semiconductor wafer W being held; and four zones 713 to 716 formed by dividing a generally ring-shaped area around the zone 712 into four equal sections in a circumferential direction. There is a slight gap between each adjacent pair of the zones. The hot plate 71 is further provided with three through holes 77 through which the support pins 70 are inserted and which are spaced 120° apart from one another on the circumference of a gap between the zones 711 and 712.

In each of the six zones 711 to 716, the resistance heating wires 76 independent of one another are installed to circulate around the zone to form an individual heater, so that each zone is heated individually by its own built-in heater. A semiconductor wafer W held by the holder 7 is heated by those built-in heaters in the six zones 711 to 716. Each of the zones 711 to 716 has a sensor 710 for measuring the temperature of each zone with a thermocouple. Each sensor 710 is connected to the controller 3 through the inside of the generally cylindrical shaft 41.

In heating the hot plate 71, the controller 3 controls the amount of power supplied to the resistance heating wires 76 installed in each zone so that the temperature of each of the six zones 711 to 716 measured by the sensor 710 becomes a given preset temperature. The controller 3 uses PID (proportional-integral-derivative) control for temperature control of each zone. In the hot plate 71, the temperature of each of the zones 711 to 716 is continuously measured until the completion of the heat treatment of a semiconductor wafer W (or, when there are a plurality of semiconductor wafers W to be processed in succession, until the completion of the heat treatment of all the semiconductor wafers W) and the amount of power supplied to the resistance heating wires 76 installed in each zone is controlled on an individual basis, i.e., the temperature of the heater built in each zone is controlled individually, so that the temperature of each zone is kept at a set temperature. The set temperature of each zone can be changed by only an individually determined offset value from a reference temperature.

The resistance heating wires 76 installed in each of the six zones 711 to 716 are connected to a power supply source (not shown) over a power line passing through the inside of the shaft 41. On the way from the power supply source to each zone, the power line from the power supply source is installed within a stainless tube filled with an insulator such as magnesia (magnesium oxide) so as to be electrically insulated from the other lines. The inside of the shaft 41 is open to the atmosphere.

The lamp house 5 includes, inside a casing 51, a light source including a plurality of (in this preferred embodiment, 30) xenon flash lamps FL, and a reflector 52 provided to cover over the light source. The lamp house 5 also has a lamp-light irradiation window 53 mounted to the bottom of the casing 51. The lamp-light irradiation window 53 forming the floor portion of the lamp house 5 is a plate-like member made of quartz. The lamp house 5 is provided above the chamber 6 so that the lamp-light irradiation window 53 is opposed to the chamber window 61. The lamp house 5 applied light from the flash lamps FL through the lamp-light irradiation window 53 and the chamber window 61 to a semiconductor wafer W held by the holder 7 within the chamber 6, to thereby heat the semiconductor wafer W.

The plurality of flash lamps FL, each of which is a rod-shaped lamp having an elongated cylindrical shape, are arranged in a plane so that they are longitudinally parallel to one another along the major surface (i.e., in the horizontal direction) of a semiconductor wafer W held by the holder 7. Accordingly, the plane defined by the arrangement of the flash lamps FL is a horizontal plane.

Figure 6:
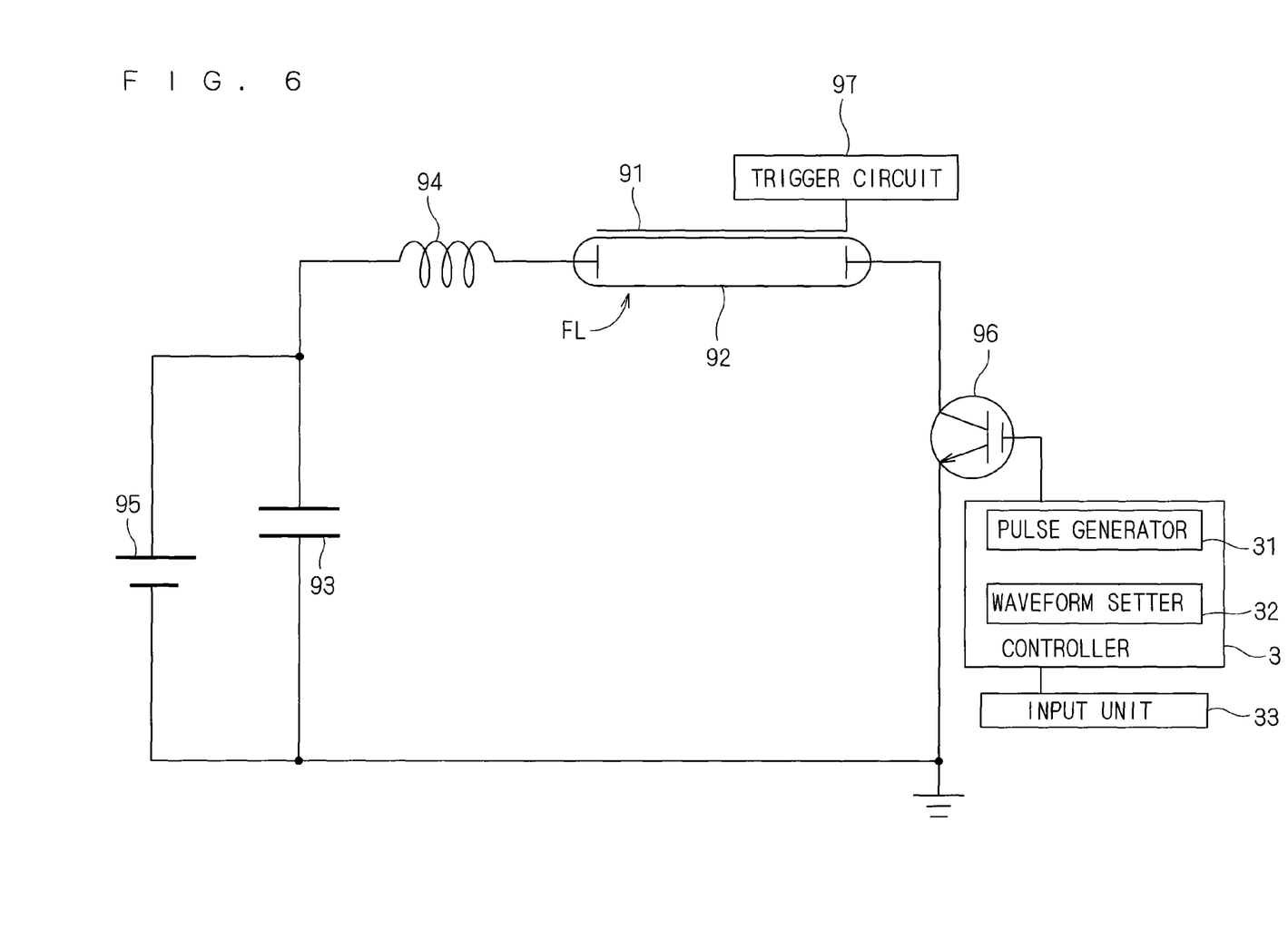
FIG. 6 shows a driving circuit for a flash lamp.

FIG. 6 illustrates a driving circuit for a flash lamp FL. As illustrated, a capacitor 93, a coil 94, a flash lamp FL, and a switching element 96 are connected in series. The flash lamp FL includes a rod-shaped glass tube (discharge tube) 92 containing a xenon gas sealed therein and having positive and negative electrodes provided on the opposite ends thereof; and a trigger electrode 91 wound on the outer peripheral surface of the glass tube 92. Upon the application of a given voltage from a power supply unit 95, the capacitor 93 is charged in response to the applied voltage. A trigger circuit 97 can apply voltage to the trigger electrode 91. The timing of the voltage application from the trigger circuit 97 to the trigger electrode 91 is under the control of the controller 3.

The present preferred embodiment employs an insulated-gate bipolar transistor (IGBT) as the switching element 96. The IGBT is a bipolar transistor that incorporates a MOSFET (metal-oxide-semiconductor field-effect transistor) into the gate and is also a switching element suitable for handling a large amount of power. The switching element 96 receives, at its gate, a pulse signal from a pulse generator 31 in the controller 3.

Even if, with the capacitor 93 in the charged state, a pulse is output to the gate of the switching element 96 and a high voltage is applied to the electrodes across the glass tube 92, no electricity will flow through the glass tube 92 in a normal state because the xenon gas is electrically insulative. However, if the trigger circuit 97 applies voltage to the trigger electrode 91 to produce an electrical breakdown, current will flow instantaneously between the electrodes across the glass tube 92, and the resultant excitation of xenon atoms or molecules will induce light emission.

The reflector 52 in FIG. 1 is provided above the plurality of flash lamps FL to cover over all those flash lamps FL. A fundamental function of the reflector 52 is to reflect the light emitted from the plurality of flash lamps FL toward the holder 7. The reflector 52 is an aluminum alloy plate, and its surface (facing the flash lamps FL) is roughened by abrasive blasting to produce a satin finish thereon. Such surface roughing is required because, if the reflector 52 has a perfect mirror surface, the intensity of the reflected light from the plurality of flash lamps FL will exhibit a regular pattern, which can cause deterioration in the uniformity of a surface temperature distribution in the semiconductor wafer W.

The controller 3 controls the aforementioned various operating mechanisms provided in the heat treatment apparatus 1. The controller 3 is similar in hardware configuration to a general computer. Specifically, the controller 3 includes a CPU for performing various computations; a ROM or read-only memory for storing basic programs therein, a RAM or readable/writable memory for storing various pieces of information therein; and a magnetic disk for storing control software, data, etc. therein. The controller 3 further includes the pulse generator 31 and a waveform setter 32 and is connected to an input unit 33. The input unit 33 may be any of various known input equipment such as a keyboard, a mouse, or a touch panel. The waveform setter 32 sets the waveform of a pulse signal based on the input contents from the input unit 33, and the pulse generator 31 generates a pulse signal with that waveform.

The heat treatment apparatus 1 further includes, in addition to the above components, various cooling structures to prevent an excessive temperature rise in the chamber 6 and in the lamp house 5 due to heat energy generated by the flash lamps FL and the hot plate 71 during the heat treatment of a semiconductor wafer W. For instance, a water cooling tube (not shown) is provided in the chamber side portion 63 and the chamber bottom portion 62 of the chamber 6. The lamp house 5 is provided with a gas supply pipe 55 and an exhaust pipe 56 to form an air cooling structure for forming a gas flow therein to exhaust heat (cf. FIGS. 1 and 5). Further, air is also supplied to a gap between the chamber window 61 and the lamp-light irradiation window 53 to cool down the lamp house 5 and the chamber window 61.

Next, a procedure for processing a semiconductor wafer W in the heat treatment apparatus 1 is described. A semiconductor wafer W to be processed herein is a semiconductor substrate doped with impurities (ions) by ion implantation. The activation of such implanted impurities and the restoration of defects induced during the ion implantation are implemented by light-irradiation heating (annealing) by the heat treatment apparatus 1.

Figure 5:
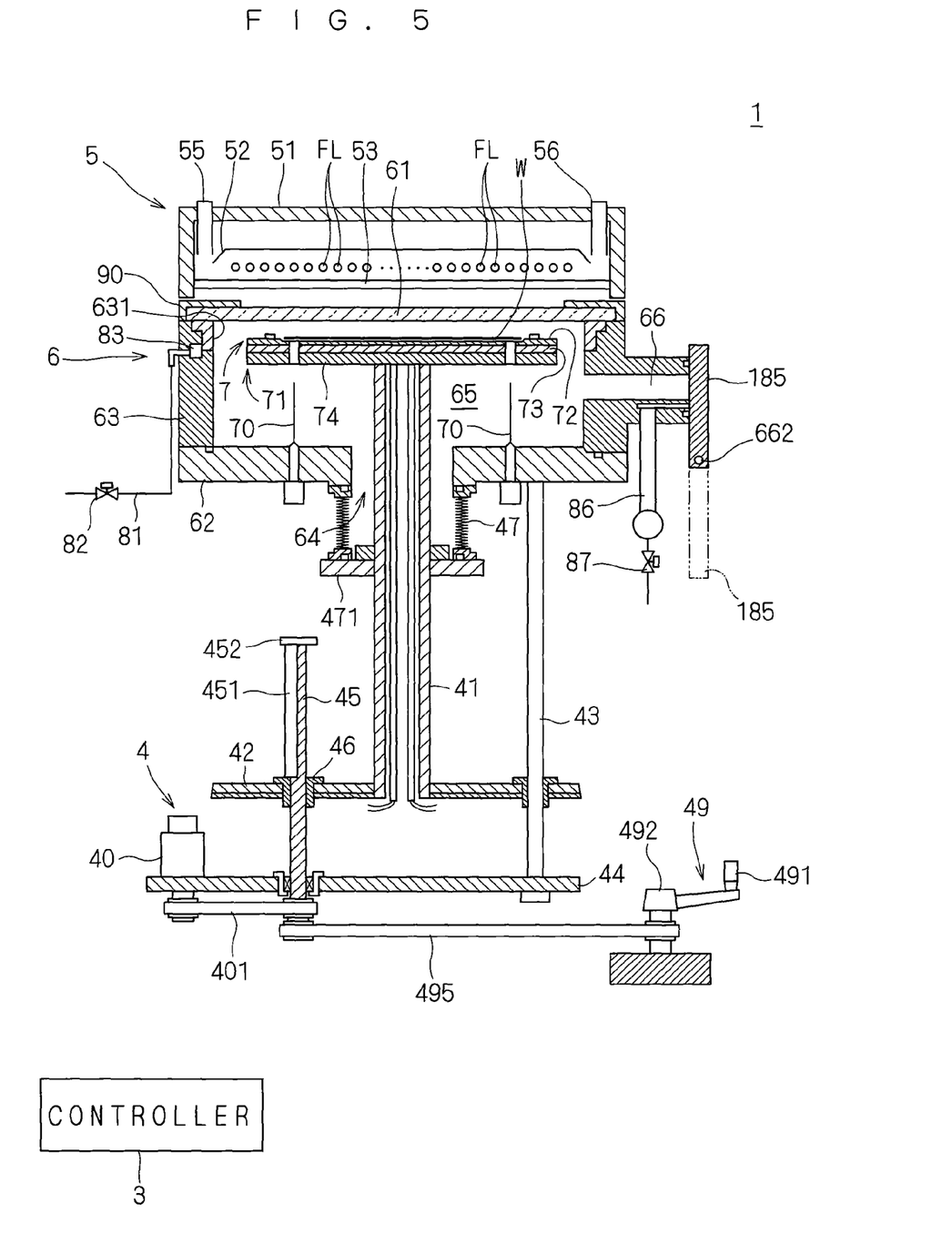
FIG. 5 is a side sectional view of the configuration of the heat treatment apparatus in FIG. 1.

First, the holder 7 is moved down from the processing position in FIG. 5 to the transfer position in FIG. 1. The "processing position" as used herein refers to the position of the holder 7 when light is applied from the flash lamps FL to the semiconductor wafer W, i.e., the position of the holder 7 in FIG. 5 within the chamber 6. The "transfer position" as used herein refers to the position of the holder 7 when the semiconductor wafer W is transported into and out of the chamber 6, i.e., the position of the holder 7 in FIG. 1 within the chamber 6. A reference position of the holder 7 in the heat treatment apparatus 1 shall be the processing position. Prior to processing, the holder 7 is in the processing position, and upon the start of processing, the holder 7 moves down to the transfer position. When moved down to the transfer position as illustrated in FIG. 1, the holder 7 is in close proximity to the chamber bottom portion 62, so that the upper ends of the support pins 70 protrude through the holder 7 above the holder 7.

Then, when the holder 7 moves down to the transfer position, the valves 82 and 87 are opened to introduce a room-temperature nitrogen gas into the heat treatment space 65 of the chamber 6. Then, the gate valve 185 is opened to open the transport opening 66, whereby the semiconductor wafer W is transported through the transport opening 66 into the chamber 6 and placed on the plurality of support pins 70 by a transport robot outside the apparatus.

The nitrogen gas supplied into the chamber 6 at the transport of the semiconductor wafer W shall be purged at a rate of about 40 L/min. The supplied nitrogen gas flows from the gas inlet buffer 83 in the direction of the arrows AR4 in FIG. 2 within the chamber 6 and will be exhausted through the outlet passage 86 and the valve 87 in FIG. 1 by using a utility exhaust system. Part of the nitrogen gas supplied into the chamber 6 is exhausted also from an exhaust port (not shown) provided inside the bellows 47. In each step described below, the nitrogen gas shall always continue to be supplied into and exhausted from the chamber 6, and the amount of the supply of the nitrogen gas can widely vary in response to each step of processing the semiconductor wafer W.

After the transport of the semiconductor wafer W into the chamber 6, the transport opening 66 is closed with the gate valve 185. Then, the holder elevating mechanism 4 moves the holder 7 upwardly from the transfer position to the processing position that is in close proximity to the chamber window 61. During the course of the upward movement of the holder 7 from the transfer position, the semiconductor wafer W is transferred from the support pins 70 to the susceptor 72 of the holder 7 and then placed and held on the upper surface of the susceptor 72. When the holder 7 is moved up to the processing position, the semiconductor wafer W held on the susceptor 72 is also brought and held at the processing position.

Each of the six zones 711 to 716 of the hot plate 71 has been heated up to a given temperature by its own individual heater (the resistance heating wires 76) built in each zone (between the upper plate 73 and the lower plate 74). With the holder 7 brought up to the processing position and into contact with the semiconductor wafer W, the semiconductor wafer W is preheated by the heaters built in the hot plate 71 and gradually rises in temperature.

Figure 7:
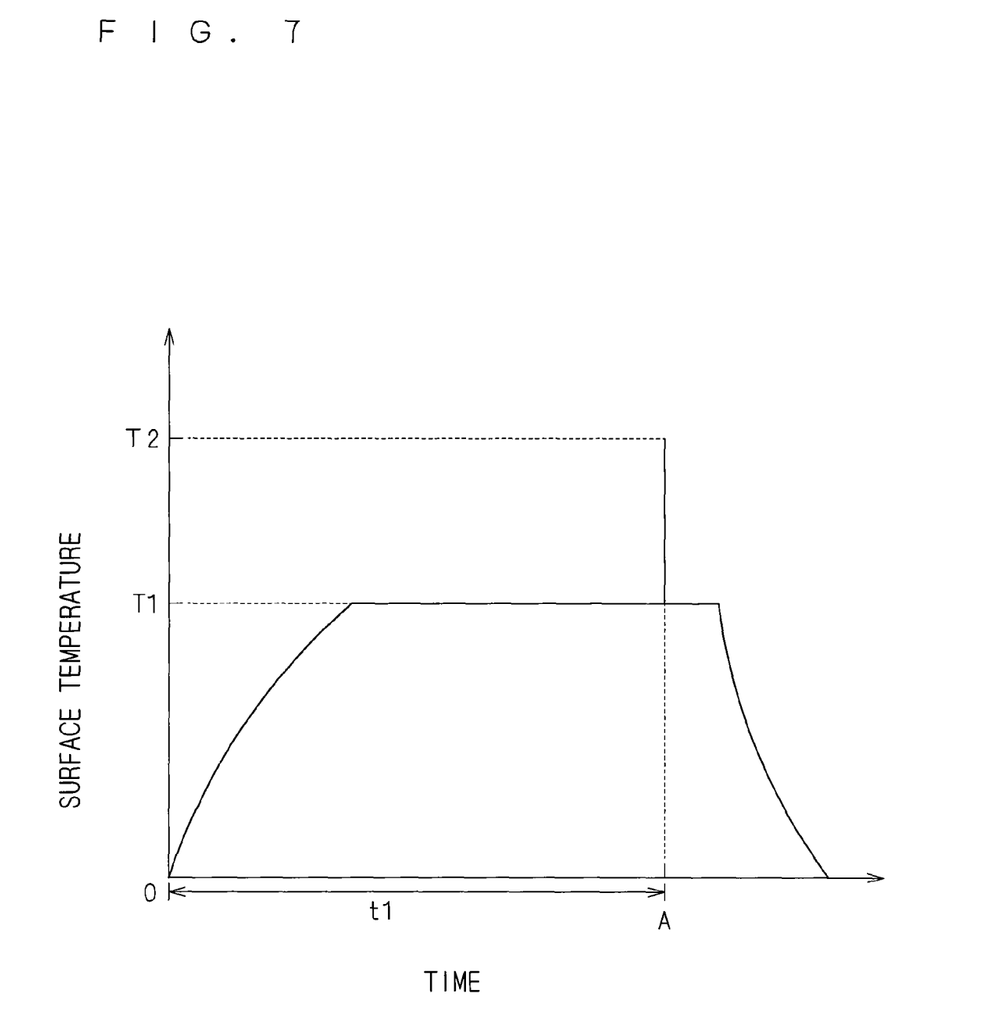
FIG. 7 is a graph showing a change in the surface temperature of a semiconductor wafer since the start of preheating.

FIG. 7 is a graph showing a change in the surface temperature of a semiconductor wafer W since the start of preheating. Preheating for time t1 at the processing position causes the temperature of a semiconductor wafer W to rise up to a preset preheating temperature T1. The preheating temperature T1 shall be on the order of 200 to 800° C., preferably on the order of 350 to 600° C. (in the present preferred embodiment, 600° C.), at which temperature there is no apprehension that impurities implanted in the semiconductor wafer W are heat-diffused. The time t1 for preheating the semiconductor wafer W shall be between about 3 and about 200 seconds (in the present preferred embodiment, 60 seconds). The distance between the holder 7 and the chamber window 61 can vary arbitrarily by controlling the amount of rotation of the motor 40 in the holder elevating mechanism 4.

After a lapse of the preheating time t1, the flash lamps FL starts light-irradiation heating (flash heating) of the semiconductor wafer W at time A. For the light irradiation by the flash lamps FL, the capacitor 93 should be charged in advance by the power supply unit 95. Then, with the capacitor 93 in the charged state, a pulse signal is output from the pulse generator 31 in the controller 3 to the switching element 96.

Figure 8:
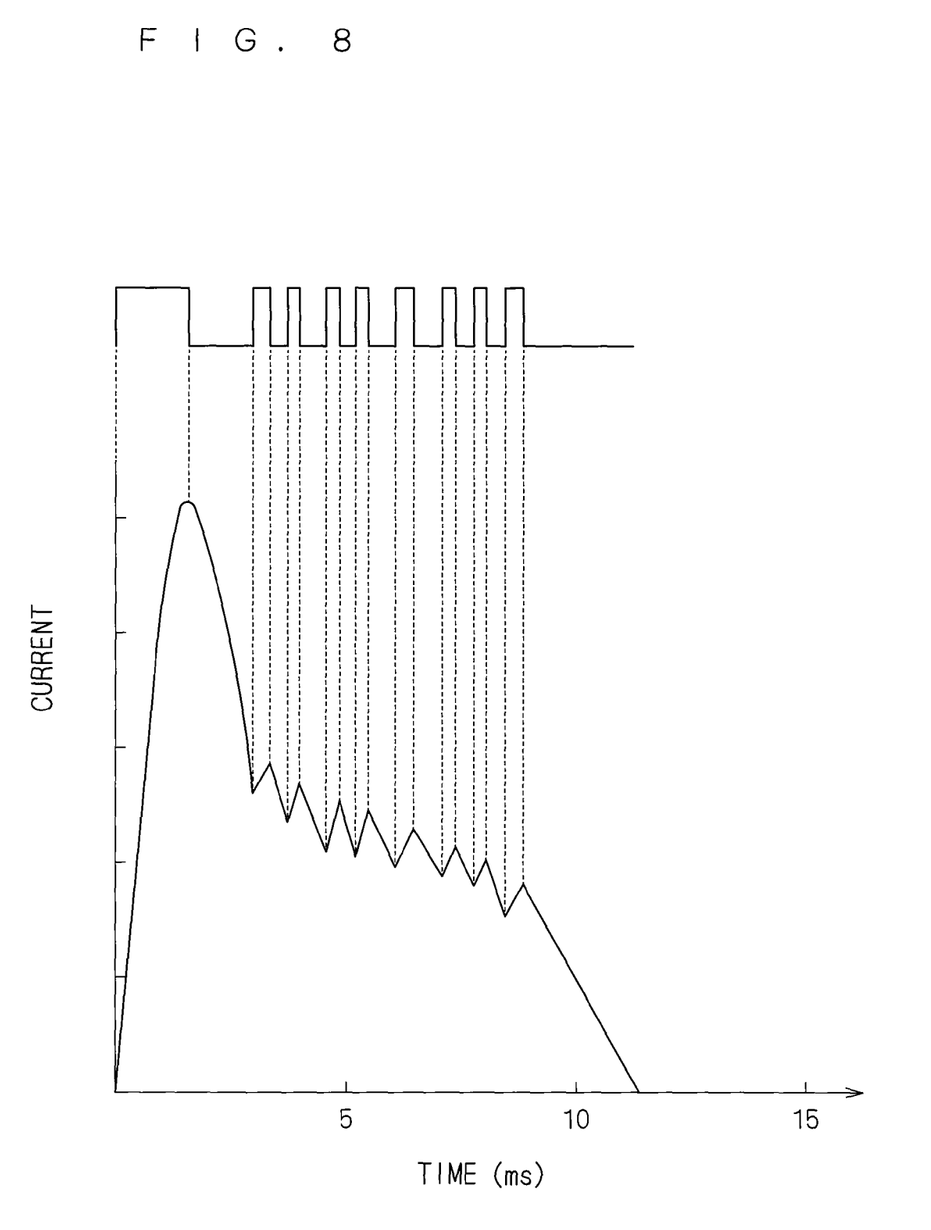
FIG. 8 is a graph showing, by way of example, a correlation between the pulse signal waveform and the current flowing through a circuit.

FIG. 8 is a graph showing, by way of example, a correlation between the pulse signal waveform and the current flowing through the circuit. In the present example, a pulse signal having a waveform as illustrated in the upper part of FIG. 8 is output from the pulse generator 31. The pulse signal waveform can be defined by inputting from the input unit 33 a recipe that sequentially sets the time (ON time) during which each pulse is at a high level and the idle time (OFF time) between pulses. When an operator inputs such a recipe from the input unit 33 to the controller 3, the waveform setter 32 in the controller 3 sets a pulse waveform as illustrated in the upper part of FIG. 8. In the pulse waveform illustrated in the upper part of FIG. 8, the first pulse is set to be relatively long and a plurality of subsequent pulses are set to be relatively short. Then, the pulse generator 31 outputs a pulse signal having a pulse waveform set by the waveform setter 32. As a result, the pulse signal having a waveform as illustrated in the upper part of FIG. 8 is applied to the gate of the switching element 96 to control driving of the switching element 96.

In synchronization with the timing of the turning on of the pulse signal output from the pulse generator 31, the controller 3 causes the trigger circuit 97 to apply voltage to the trigger electrode 91. This results in that, when the pulse signal input to the gate of the switching element 96 is ON, current flows inevitably between the electrodes across the glass tube 92, and the resultant excitation of xenon atoms or molecules induces light emission. Outputting the pulse signal having a waveform as illustrated in the upper part of FIG. 8 from the controller 3 to the gate of the switching element 96 and applying voltage to the trigger electrode 91 in synchronization with the timing of the turning on of the pulse signal produce a flow of current as illustrated in the lower part of FIG. 8 through the circuit including the flash lamp FL. In other words, when a pulse signal input to the gate of the switching element 96 is ON, the value of current flowing through the glass tube 92 in the flash lamp FL will increase. It is noted herein that an individual current waveform corresponding to each pulse is defined by the constant of the coil 94.

The flow of current having a waveform as illustrated in the lower part of FIG. 8 induces light emission from the flash lamp FL. An emission output of the flash lamp FL is almost proportional to the current flowing through the flash lamp FL. Accordingly, the output waveform of the emission output of the flash lamp FL shows a pattern as illustrated in the upper part of FIG. 9. In accordance with the output waveform from the flash lamp FL as illustrated in the upper part of FIG. 9, the semiconductor wafer W held at the processing position by the holder 7 is irradiated with light. As a result, the surface temperature of the semiconductor wafer W changes as illustrated in the lower part of FIG. 9.

If, as in conventional cases, the flash lamps FL emit light without using the switching elements 96, the charge stored in the capacitor 93 is consumed by only one-time light emission, so that the flash lamps FL will produce a single-pulse output waveform having a width between about 0.1 and 10 milliseconds On the other hand, if, as in the present preferred embodiment, a switching element 96 is connected in the circuit and a pulse signal as illustrated in the upper part of FIG. 8 is output to the gate of the switching element 96, it can be said in a sense that light emission from the flash lamp FL is chopper-controlled. The charge stored in the capacitors 93 is thus divided for consumption, and accordingly the flash lamps FL will repeat flashing within an extremely short period of time. It is to be noted, as illustrated in FIG. 8, that the emission output will never become exactly zero even during the repeated flashing of the flash lamps FL because before the current value becomes exactly zero, the next pulse is applied to the gate of the switching element 96 to increase the current value again.

Figure 9:
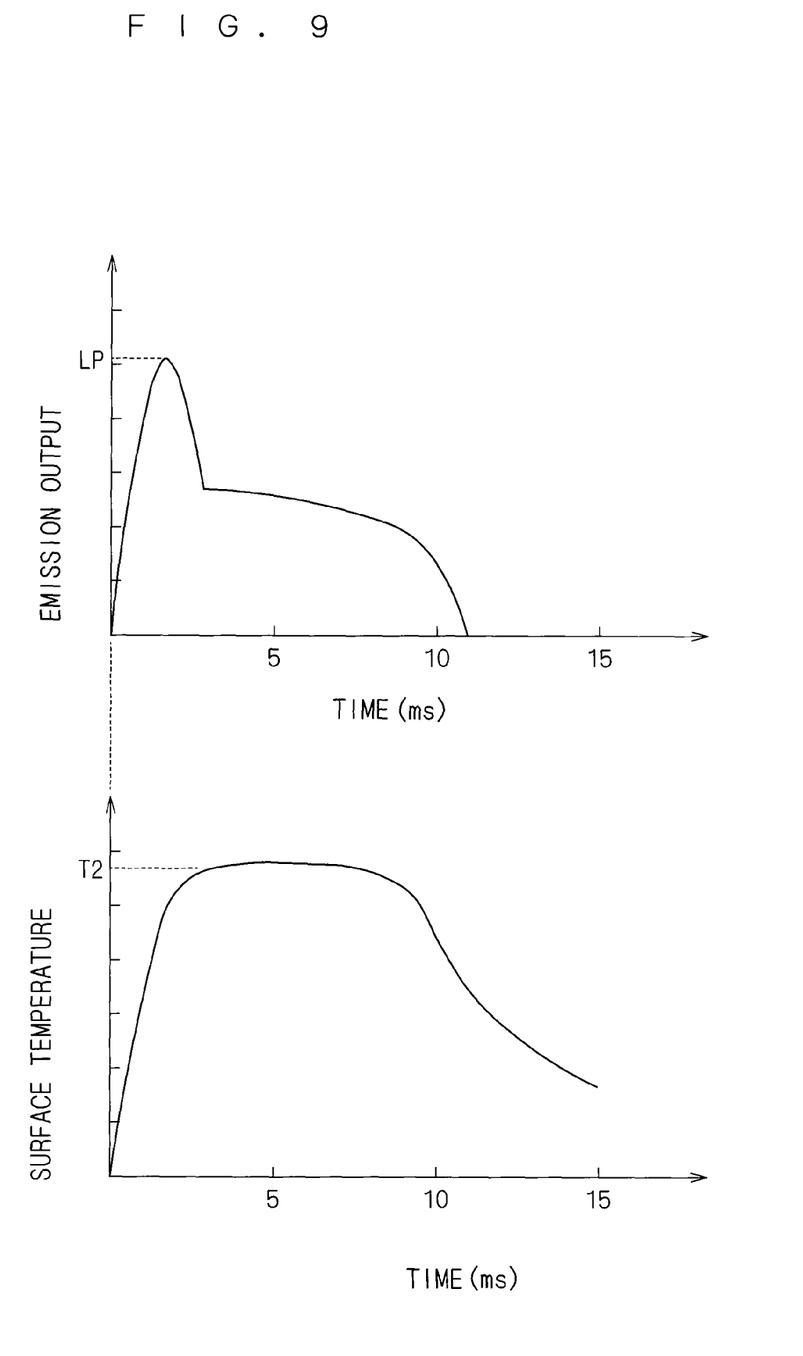
FIG. 9 is a graph showing an example of a correlation between the emission output of flash lamps and the surface temperature of a semiconductor wafer.

It can be said that the output waveform as illustrated in the upper part of FIG. 9 can be produced by two-stage light irradiation. More specifically, the two-stage light irradiation performed includes a first stage of light irradiation of a semiconductor wafer W, which irradiation produces an output waveform that reaches a peak at an emission output LP; and a second stage of supplemental light irradiation of the semiconductor wafer W, which irradiation is started after the peak of the first-stage light irradiation, producing an emission output smaller than the emission output LP.

To be more specific, an output waveform that reaches a peak at the emission output LP is produced by initially applying a relatively long pulse signal to the gate of the switching element 96. Then, when the emission output of the flash lamp FL in the first stage after the peak becomes two thirds or less the peak emission output LP, a relatively short pulse signal is intermittently applied to the gate of the switching element 96 to start the second-stage supplemental light irradiation. The first-stage light-irradiation time (the time from the start of the first-stage light irradiation to the start of the second-stage light irradiation by the flash lamps FL) shall be between 0.1 and 10 milliseconds. The second-stage supplemental irradiation shall always produce an emission output that is two thirds or less the emission output LP. The second-stage light-irradiation time shall be 5 milliseconds or more. It is however to be noted that a total time of light irradiation by the flash lamps FL during one-time flash heating, i.e., a total of the first-stage light-irradiation time and the second-stage light-irradiation time, should be one second or less.

By the first-stage light irradiation that produces the peak emission output, the surface temperature of the semiconductor wafer W rises from the preheating temperature T1 up to a processing temperature T2. The processing temperature T2 shall be between about 1000 and about 1300° C. (in the present preferred embodiment, about 1000° C.), at which temperature impurities implanted in the semiconductor wafer W are activated. In the present preferred embodiment, the implementation of the second-stage supplemental light irradiation subsequent to the first-stage light irradiation allows the surface temperature of the semiconductor wafer W to be maintained at the processing temperature T2 for as long as 5 milliseconds or more. The result of such heating is that the temperature even at a somewhat greater depth below the ion-implanted layer, to which depth defects are introduced, can also be raised to some extent, so that the restoration of defects can proceed as well. In addition, as illustrated in the lower part of FIG. 9, the surface temperature of the semiconductor wafer W will never considerably rise beyond the processing temperature T2. This prevents the semiconductor wafer W from being damaged thermally.

After the completion of the second-stage supplemental light irradiation, the surface temperature of the semiconductor wafer W drops rapidly from the processing temperature T2. Then, after the completion of the two-stage light-irradiation heating by the flash lamps FL and after approximately a 10-second standby at the processing position, the holder elevating mechanism 4 again moves the holder 7 down to the transfer position in FIG. 1, at which position the semiconductor wafer W is transferred from the holder 7 to the support pins 70. Thereafter, the transport opening 66 which has been closed by the gate valve 185 is opened, so that the semiconductor wafer W placed on the support pins 70 is transported out of the apparatus by the transport robot. This completes the light-irradiation heating of the semiconductor wafer W in the heat treatment apparatus 1.

As described previously, during the heat treatment of the semiconductor wafer W in the heat treatment apparatus 1, a nitrogen gas is continuously supplied into the chamber 6. The amount of that supply shall be approximately 30 liters per minute when the holder 7 is at the processing position, and approximately 40 liters per minute when the holder 7 is at any position other than the processing position.

As discussed earlier, in the conventional single-pulsed flash-light irradiation, the implementation of high-energy irradiation or long-pulsed flash-light irradiation in order to enable even the restoration of defects will cause a significant rise in the surface temperature, thereby giving thermal damage to the semiconductor wafer W. In the present preferred embodiment, the first-stage light irradiation producing a peak emission output is performed first and then the second-stage and little weaker supplemental light irradiation is performed. The implementation of such two-stage light-irradiation heating prevents the surface temperature of the semiconductor wafer W from considerably rising beyond the processing temperature T2 and allows the temperature even at a somewhat greater depth below the surface to be raised to some extent. The result is that both the activation of implanted ions and the restoration of introduced defects can be implemented without any thermal damage to the semiconductor wafer W.

In the two-stage light-irradiation heating according to the present preferred embodiment, the second-stage supplemental light irradiation is started when the emission output of the flash lamp FL in the first stage becomes two thirds or less the peak emission output LP, and the second-stage light irradiation is performed, always producing an emission output that is two thirds or less the emission output LP. This is because, if the emission output in the second stage exceeded two thirds the peak emission output LP, the surface temperature of the semiconductor wafer W would continue to rise considerably beyond the processing temperature T2 as in the case of long-pulsed flash-light irradiation. The reason why the first-stage light-irradiation time is 10 milliseconds or less is also because the light irradiation time of more than 10 milliseconds can cause the surface temperature of the semiconductor wafer W to rise beyond the processing temperature T2, thereby causing thermal damage.

In the two-stage light-irradiation heating, the reason why the second-stage light-irradiation time is 5 milliseconds or more is in order to maintain the surface temperature of the semiconductor wafer W at the processing temperature T2 for such a period of time that the restoration of defects proceeds.

Figure 10:
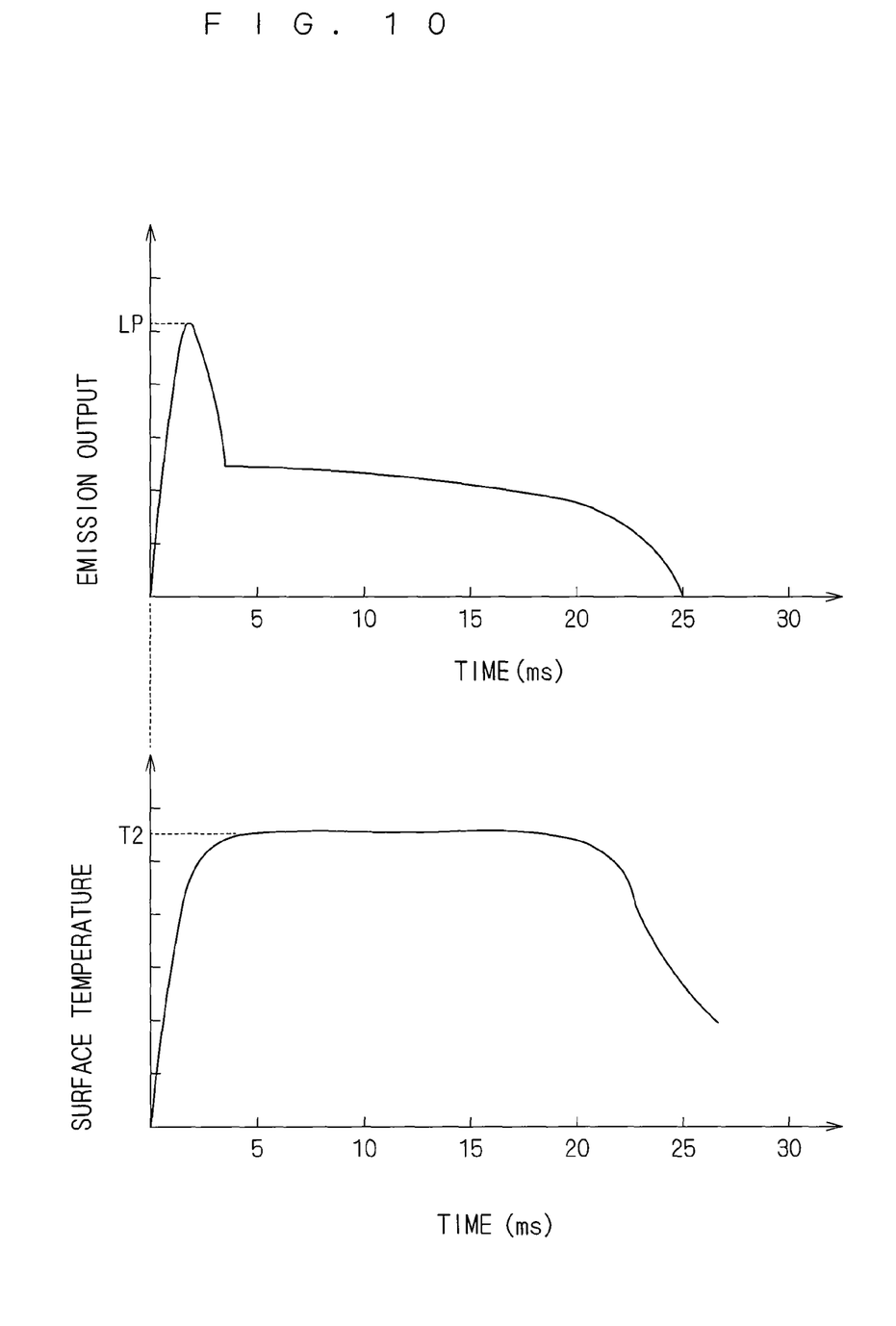
FIG. 10 is a graph showing another example of a correlation between the emission output of flash lamps and the surface temperature of a semiconductor wafer.

While the preferred embodiment according to the invention has been described so far, various modifications of the invention in addition to those described above may be made without departing from the scope and spirit of the invention. For instance, the two-stage light-irradiation heating by the flash lamps FL is not limited to the example of FIG. 9; it may be such as illustrated in FIG. 10. Also in the example in the upper part of FIG. 10, the two-stage light-irradiation heating is performed, which includes a first stage of light irradiation of a semiconductor wafer W, which irradiation produces an output waveform that reaches a peak at the emission output LP; and a second stage of supplemental light irradiation of the semiconductor wafer W, which irradiation is started after the peak of the first-stage light irradiation, producing an emission output smaller than the emission output LP. The example in the upper part of FIG. 10 is different from that in the upper part of FIG. 9 in that the second-stage light-irradiation time is longer than that in the example of FIG. 9. By prolonging the second-stage light-irradiation time for light irradiation producing an emission output that is two thirds or less the peak emission output LP, the time during which the surface temperature of the semiconductor wafer W is maintained at the processing temperature T2 can also be prolonged as illustrated in the lower part of FIG. 10.

In this case, also, the surface temperature of the semiconductor wafer W will never considerably rise beyond the processing temperature T2, and the temperature even at a somewhat greater depth below the surface can be raised to some extent. Thus, as in the above preferred embodiment, both the activation of implanted ions and the restoration of introduced defects can be implemented without any thermal damage to the semiconductor wafer W. Although the second-stage light-irradiation time may be still longer than in the example of FIG. 10, a total of the first-stage light-irradiation time and the second-stage light-irradiation time should be one second or less.

In summary, the light-irradiation heating for a total light-irradiation time of one second or less (what is called "millisecond annealing") should be implemented by the two-stage irradiation including the first stage of light irradiation of a semiconductor wafer W, which irradiation produces an output waveform that reaches a peak at the emission output LP; and the second stage of supplemental light irradiation of the semiconductor wafer W, which irradiation is started after the peak, producing an emission output smaller than the emission output LP. This allows the surface temperature of the semiconductor wafer W to be maintained at the processing temperature T2 and also allows the temperature even at a somewhat greater depth below the surface to be raised to some extent, thus achieving both the activation of implanted ions and the restoration of introduced defects without any thermal damage to the semiconductor wafer W.

The means of setting a pulse signal waveform is not limited to a one-by-one input of parameters, such as pulse width, from the input unit 33. For example, a waveform may be input directly and graphically from the input unit 33 by an operator; or a previously set waveform stored in a storage such as a magnetic disk may be read out; or a waveform may be downloaded from outside the heat treatment apparatus 1.

Although in the above preferred embodiment, the timing of voltage application to the trigger electrodes 91 is synchronized with the timing of turning on of a pulse signal, the timing of the trigger-voltage application is not limited thereto; the voltage may be applied at fixed intervals irrespective of the pulse signal waveform. If a pulse signal has a narrow space width so that energization by the next pulse will be started under the condition that the value of current produced to flow through the flash lamps FL by the previous pulse still remains at a given value or higher, the current continues to flow as-is through the flash lamps FL. In this case, it is not necessary to apply the trigger voltage for every pulse. If, as illustrated in FIG. 8 of the above preferred embodiment, all the space widths of the pulse signal are narrow, the trigger voltage may be applied only when the initial pulse (or in addition thereto, an initial pulse in the second stage) is applied; thereafter, the current waveform as illustrated in the lower part of FIG. 8 can be produced by only outputting a pulse signal as illustrated in the upper part of FIG. 8 to the gate of the switching element 96, without the repeated application of the trigger voltage. In other words, the timing of the trigger-voltage application may be determined arbitrarily as long as it coincides with the timing that current flows through the flash lamp FL when a pulse signal is turned on.

Although the lamp house 5 in the above preferred embodiment includes the 30 flash lamps FL, the invention is not limited thereto; the number of flash lamps FL may be any arbitrary number. Further, the flash lamps FL are not limited to xenon flash lamps; they may be krypton flash lamps.

In the above preferred embodiment, IGBTs are used as the switching elements 96; the invention is not limited thereto. For example, the switching elements 96 may be any transistor other than IGBTs as long as they are elements that can turn the circuit on or off in response to the input pulse signal waveform. However, since the flash lamps FL consume a considerably large amount of power for light emission, the switching elements 96 may preferably be IGBTs or GTO (gate turn-off) thyristors that are suitable for handling a large amount of power.

The circuit configuration may be different from that in FIG. 6 as long as the two-stage light irradiation is possible. For example, two power supply circuits having different coil constants may be connected to a single flash lamp FL.

Further, the light source is not limited to the flash lamps FL as long as the two-stage light irradiation is possible. The light source should allow light irradiation for an irradiation time of one second or less; it may, for example, be a laser.

A substrate to be processed by the heat treatment apparatus according to the invention is not limited to a semiconductor wafer; it may, for example, be a glass substrate for liquid crystal display.

While the invention has been described in detail, the foregoing description is in all aspects illustrative and not restrictive. It is understood that numerous other modifications and variations can be devised without departing from the scope of the invention.

What is claimed is:

1. A heat treatment method for heating a substrate by light irradiation of the substrate, the method comprising:
    a temperature-raising step of raising a surface temperature of said substrate to a predetermined processing temperature by light irradiation of said substrate from a flash lamp, producing an output waveform that reaches a peak at a first emission output; and
    a temperature-maintaining step of maintaining the surface temperature of said substrate at said processing temperature for 5 milliseconds or more by performing supplemental light irradiation of the substrate from the flash lamp after said peak, producing an emission output smaller than said first emission output,
    wherein a total of a light irradiation time in said temperature-raising step and a light irradiation time in said temperature-maintaining step is one second or less, and
    the light irradiation in the temperature-raising step and in the temperature-maintaining step is executed by applying a pulse signal to a gate of an insulated-gate bipolar transistor (IGBT) connected to the flash lamp to chopper control light emission from the flash lamp.

2. The heat treatment method according to claim 1, wherein the supplemental light irradiation in said temperature-maintaining step is started after said peak and when an emission output in said temperature-raising step becomes two thirds or less said first emission output.

3. The heat treatment method according to claim 1, wherein a light irradiation time in said temperature-raising step is between 0.1 and 10 milliseconds.

4. The heat treatment method according to claim 3, wherein a light irradiation time in said temperature-raising step is 5 milliseconds or more.

5. The heat treatment method according to claim 1, wherein impurities implanted in said substrate is activated by raising the surface temperature of said substrate to said processing temperature in said temperature-raising step, and
the restoration of defects introduced to said substrate is implemented by maintaining the surface temperature of said substrate at said processing temperature for 5 milliseconds or more in said temperature-maintaining step.

* * * * *